US008730644B2

(12) United States Patent
Fujisawa et al.

(10) Patent No.: US 8,730,644 B2
(45) Date of Patent: May 20, 2014

(54) BIPOLAR ELECTROSTATIC CHUCK (75) Inventors: Hiroshi Fujisawa, Nara (JP); Yoshiaki Tatsumi, Kawasaki (JP)

(73) Assignee: Creative Technology Corporation, Tokyo (JP)

( * ) Notice: Subject to any disclaimer, the term of this patent is extended or adjusted under 35 U.S.C. 154(b) by 400 days.

(21) Appl. No.: 12/997,826

(22) PCT Filed: Jun. 30, 2009

(86) PCT No.: PCT/JP2009/061975
§ 371 (c)(1),
(2), (4) Date: Dec. 13, 2010

(87) PCT Pub. No.: WO2010/004915
PCT Pub. Date: Jan. 14, 2010

(65) Prior Publication Data
US 2011/0102965 A1 May 5, 2011

(30) Foreign Application Priority Data

Jul. 8, 2008 (JP) ................................. 2008-177797

(51) Int. Cl.
*H01L 21/683* (2006.01)
*H01T 23/00* (2006.01)

(52) U.S. Cl.
USPC ........................................................ 361/234

(58) Field of Classification Search
USPC ........................................................ 361/234
See application file for complete search history.

(56) References Cited

U.S. PATENT DOCUMENTS

| 5,656,093 A | 8/1997 | Burkhart et al. |
| 2005/0047057 A1 | 3/2005 | Kwon |
| 2007/0223173 A1 | 9/2007 | Fujisawa et al. |

FOREIGN PATENT DOCUMENTS

| JP | 63-299137 A | 12/1988 |
| JP | 1-274938 A | 11/1989 |
| JP | 6-314735 A | 11/1994 |
| JP | 9-223729 A | 8/1997 |
| JP | 9-327188 A | 12/1997 |
| JP | 2003-179128 A | 6/2003 |
| JP | 2004-22889 A | 1/2004 |
| JP | 2004-356350 A | 12/2004 |
| JP | 2005-12144 A | 1/2005 |
| JP | 2005-33125 A | 2/2005 |

OTHER PUBLICATIONS
Translation of JP 2005-033125. Feb. 3, 2005.*

(Continued)

*Primary Examiner* — Rexford Barnie
*Assistant Examiner* — Christopher Clark
(74) *Attorney, Agent, or Firm* — Birch, Stewart, Kolasch & Birch, LLP (57) ABSTRACT Provided is a bipolar electrostatic chuck, which has excellent substrate attracting/holding performance when a voltage is applied, and excellent residual charges reducing performance when voltage application is stopped. The bipolar electrostatic chuck includes at least an electrode layer including a first electrode and a second electrode, and an upper insulating layer which forms a substrate attracting surface for attracting a substrate. In a case where a surface of the electrode layer is regarded to be divided into a plurality of virtual cells having a predetermined width (L) in an x direction and a y direction, first electrode sections forming the first electrode and second electrode sections forming the second electrode are alternately arranged in the plurality of virtual cells in the x direction, and are alternately arranged in the plurality of virtual cells in the y direction.

5 Claims, 4 Drawing Sheets (56) References Cited

OTHER PUBLICATIONS

English translation of International Preliminary Report on Patentability dated Aug. 2, 2010, issued in PCT International Application No. PCT/JP2009/061975 and mailed on Mar. 24, 2011.

Extended European Search Report dated Aug. 12, 2011, for Application No. 09794361.7.
International Search Report for PCT/JP2009/061975 mailed Aug. 4, 2009.

* cited by examiner

BIPOLAR ELECTROSTATIC CHUCK

TECHNICAL FIELD

The present invention relates to a bipolar electrostatic chuck, and more specifically, to a bipolar electrostatic chuck which has excellent substrate attracting/holding performance when a voltage is applied, and is capable of canceling residual charges promptly when voltage application is stopped.

BACKGROUND ART

An electrostatic chuck is used for attracting and holding a semiconductor substrate in various apparatuses such as an ion implantation apparatus, an ion doping apparatus, and a plasma immersion in a semiconductor manufacturing process, an exposing apparatus using an electron beam or an extreme ultraviolet (EUV) lithography, or a wafer inspection apparatus for silicon wafers or the like. In addition, in a field of manufacturing liquid crystal displays, the electrostatic chuck is used for attracting and holding an insulating substrate in a substrate combining apparatus, which is used for filling liquid crystal between glass substrates, or in an ion doping apparatus.

The electrostatic chuck usually attracts a substrate via an upper insulating layer made of a high electric insulating material such as a polyimide film or a ceramic material. In addition, the electrostatic chuck is used inside a vacuum chamber or in the environment with very low humidity. Therefore, the electrostatic chuck itself is apt to be charged easily. Therefore, there is a problem that charged particles such as ions and electrons that are used for processing of the substrate may be attracted by the upper insulating layer so as to generate residual charges, which maintains the substrate in the attracted state even after a long period from power-off. In addition, there is also a problem that charged and floating particles around the electrostatic chuck may be attracted.

In order to cancel residual charges of the electrostatic chuck, it is necessary to provide a path for the accumulated charges to flow easily to the earth (ground) or the like, or to supply charges having opposite polarity to the portion where the charges exist. However, in recent years, a structure of the electrostatic chuck is apt to be complicated because of necessities of improving attraction force of the electrostatic chuck or processing substrates of increasing size. For this reason, it is difficult to cancel the residual charges completely by leading the charges to flow to the earth or by supplying charges having the opposite polarity.

Therefore, there is proposed a method, for example, in which a part of the upper insulating layer on the substrate side is cut off (step section is provided) corresponding to the part of the electrode layer where no electrode exists so that the upper insulating layer does not contact directly with the substrate in the part where no electrode exists (see FIG. 1(c) of Patent Literature 1). In the upper insulating layer corresponding to the part where no electrode exists, there is formed a dielectric polarization along the transverse direction connecting the end of the electrode existing nearby and the substrate to be attracted. The charges accumulated in this direction are hardly canceled by electric control after voltage application is stopped. Therefore, the above-mentioned proposal relates to a method of canceling charges that are hardly canceled by electric control, by cutting off the upper insulating layer corresponding to the part where no electrode exists.

However, as described above, in recent years, an electrode having a complicated shape such as a comb-shaped electrode is studied for improving the attraction force, and hence it is actually difficult to adopt the above-mentioned method for such electrode. In addition, even if the above-mentioned method can be adopted, it is necessary to supply appropriate and proper amount of charges having the opposite polarity to the part where residual charges exist, in order to cancel completely the charges accumulated once in the electrostatic chuck by electric control or the like. The control or the like is very difficult.

CITATION LIST

Patent Literature

Patent Literature 1: JP 06-314735 A

SUMMARY OF INVENTION

Technical Problem

Figure 6:
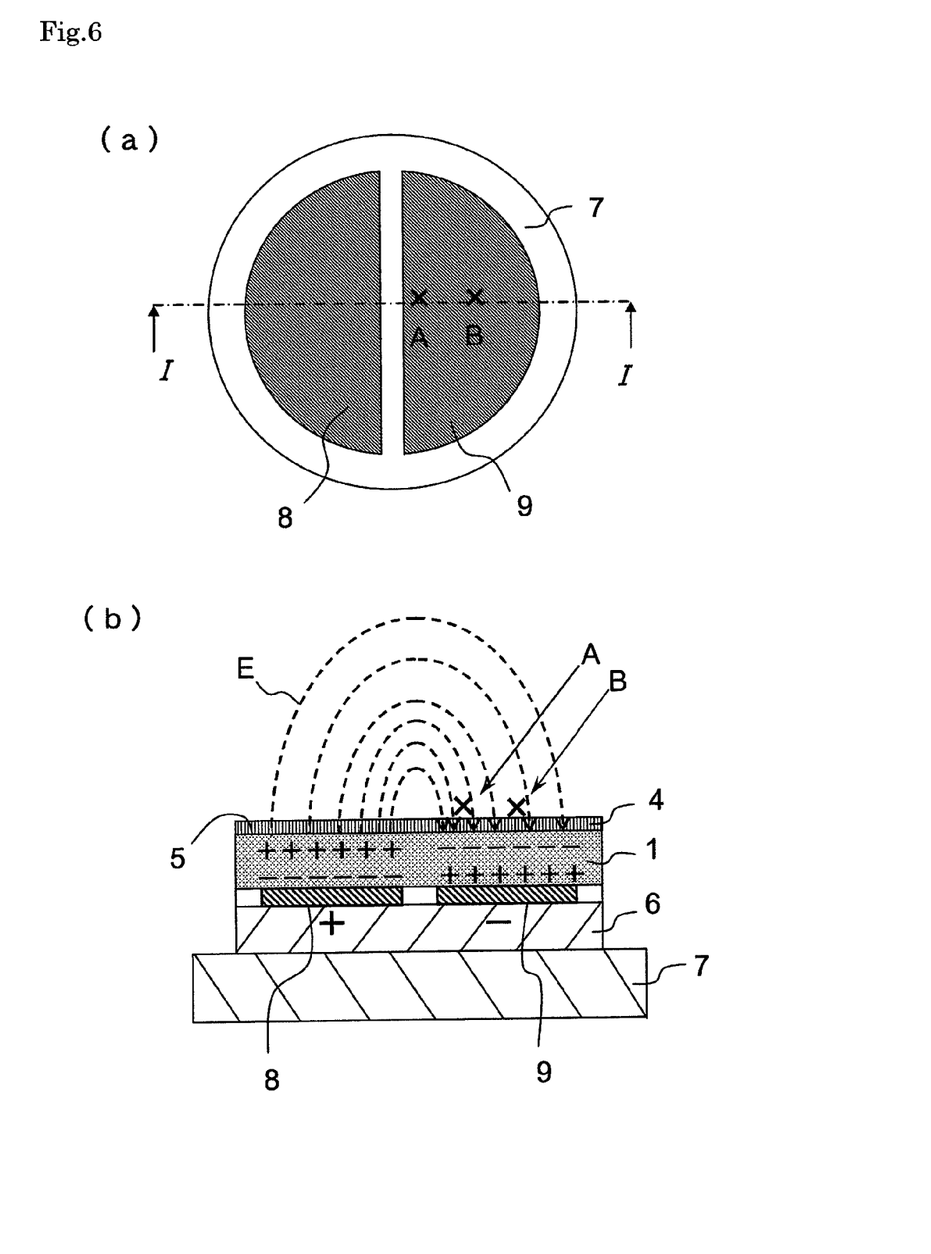

In such situation, the inventors of the present invention studied to optimize an electrode shape that is hard to form the residual charges instead of canceling the residual charges of the electrostatic chuck afterward. Here, FIG. 6 illustrate a conventional example of a bipolar electrostatic chuck having two semicircle electrodes 8 and 9, in which FIG. 6(a) illustrates a plan schematic diagram of the electrodes 8 and 9 viewed from an attracting surface side for attracting a substrate 4, and FIG. 6(b) illustrates a schematic diagram of the I-I cross section of FIG. 6(a). First, when the electrode 8 is connected to a positive electrode side of a power supply (not shown), and the electrode 9 is connected to a negative electrode side of the power supply so as to apply a voltage, electric flux lines E as illustrated in FIG. 6(b) are formed on a substrate attracting surface 5 side by the dielectric polarization of an upper insulating layer 1. Further, if there exist charged particles such as ions and electrons in the region where the electric flux lines E are distributed, positive charged particles are moved along the electric flux lines E to the negative electrode side while negative charged particles are moved along the electric flux lines E to the positive electrode side. It is considered that those charged particles gather at the vicinity of the substrate attracting surface 5 of the upper insulating layer 1 having very high electrical resistance along the way.

Next, when the voltage application is stopped, the electric flux lines E are disappeared, and hence it is considered that a part of the charges accumulated in the upper insulating layer flows to the ground side via the electrode or is canceled together with charges of the different polarity. Here, for example, point A is closer to an electrode 2 on the positive side than point B in the diagram. Therefore, it is considered that charges accumulated at point A are canceled together with charges of the different polarity nearby in a relatively easy manner. On the other hand, if the different pole is relatively distant like the point B, it takes longer period until the charges accumulated in the point B are canceled than the charges accumulated in the point A. Therefore, unless the charges move to the ground side to be disappeared, the charges may remain as residual charges.

Therefore, the inventors of the present invention have studied earnestly to find a bipolar electrostatic chuck that is capable of canceling the charges generated on the substrate attracting surface when a voltage is applied, promptly when the voltage application is stopped. As a result, it was found that the electrostatic chuck in which charges of different polarities are canceled efficiently so that residual charges are hardly formed and which has excellent attraction force can be obtained by adopting such an electrode shape that when voltages of different polarities are applied, around one electrode having one polarity, the other electrode having the other polarity is arranged. Thus, the present invention is completed.

Therefore, an object of the present invention is to provide a bipolar electrostatic chuck, which has excellent substrate attracting/holding performance when a voltage is applied, and can cancel residual charges promptly when voltage application is stopped.

Solution to Problem

Specifically, the present invention provides a bipolar electrostatic chuck, at least including: an electrode layer including a first electrode and a second electrode; and an upper insulating layer which forms a substrate attracting surface for attracting a substrate, in which in a case where a surface of the electrode layer is regarded to be divided into a plurality of virtual cells having a predetermined width (L) arranged in an x direction and a y direction, first electrode sections forming the first electrode and second electrode sections forming the second electrode are alternately arranged in the plurality of virtual cells in the x direction, and are alternately arranged in the plurality of virtual cells in the y direction.

Figure 1:
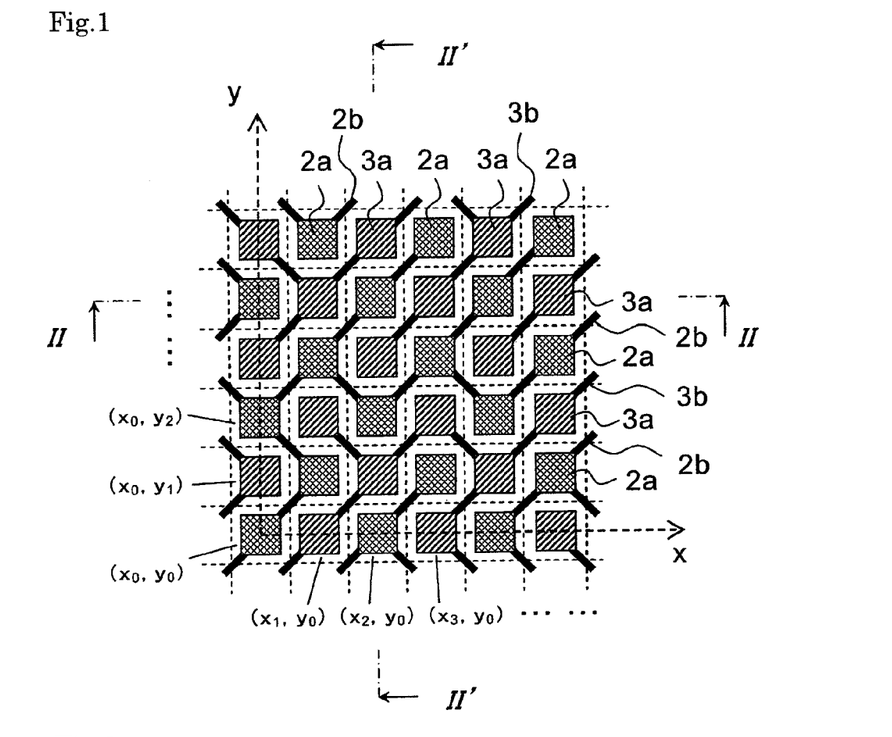
FIG. 1 is a plan explanatory diagram of a first electrode and a second electrode forming an electrode layer of the present invention.
Figure 2:
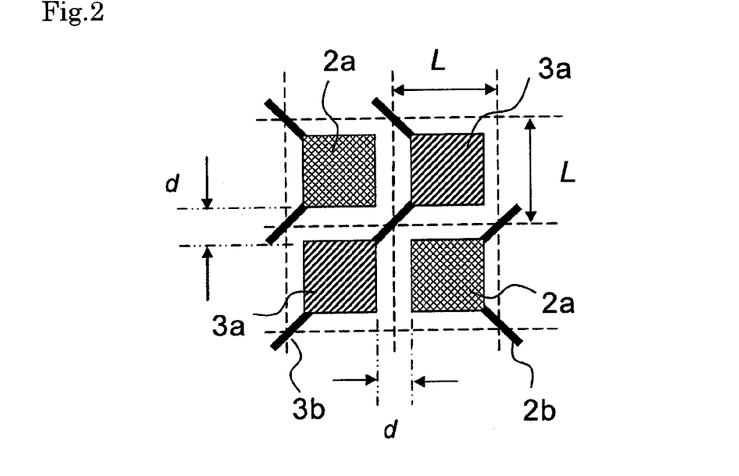
FIG. 2 is a partial enlarged diagram of FIG. 1.

In the present invention, the electrode layer having the first electrode and the second electrode is required to satisfy the following electrode shape condition on the surface corresponding to the substrate attracting surface, as illustrated in FIGS. 1 and 2, in the case where the electrode layer is regarded to be divided into the plurality of virtual cells having the predetermined width L in the x direction and the y direction. Specifically, as to the virtual cells $(x_n, y_m)$, $(x_{n+1}, y_m)$, $(x_{n+2}, y_m)$, and so on arranged in the x direction, first electrode sections 2a forming the first electrode and second electrode sections 3a forming the second electrode are required to be alternately arranged, while as to the virtual cells $(x_n, y_m)$, $(x_n, y_{m+1})$, $(x_n, y_{m+2})$, and so on in the y direction, the first electrode sections 2a and the second electrode sections 3a are required to be alternately arranged (n and m are integers of 0 or larger). Here, there is no specific limitation about a plane shape of each electrode section. The plane shape of each electrode section may be a circular shape, an elliptical shape, or a triangular or other polygonal shape as well as the rectangular shape as illustrated in FIGS. 1 and 2. In addition, in the case of the polygonal shape, apexes thereof may be rounded by a predetermined curvature radius so as to prevent discharge between neighboring electrodes. Further, it is preferred that all the first electrode sections 2a and the second electrode sections 3a have the same shape, and be arranged in the same orientation so that barycenters of the electrode sections are overlaid at the center of the virtual cells, in order that the charges generated once are effectively canceled by charges of the opposite polarity.

As illustrated in FIG. 2, a space d between the first electrode section and the second electrode section arranged in the above-mentioned virtual cell maybe designed appropriately depending on a voltage to be applied, that is, may be designed appropriately because the required attraction force is different depending on a type and a size of the substrate to be attracted. For instance, in the case of the electrostatic chuck for attracting a silicon wafer having a diameter of 300 mm, it is preferred to set the space d to a value within the range of 0.5 to 2 mm considering the applied voltage (approximately ±500 to ±1500 V in usual case). In addition, the cell width L as a premise of the above-mentioned condition may be set appropriately in accordance with a type and a size of the substrate to be attracted. For instance, in the case of attracting a silicon wafer having a diameter of 300 mm, it is preferred to set the cell width L within the range of 1 to 20 mm so that the first electrode section and the second electrode section are arranged.

The first electrode sections and the second electrode sections arranged in the cells may respectively form the same potential through connection parts. Specifically, as illustrated in FIGS. 1 and 2, the first electrode 2 has first connection parts 2b for connecting the first electrode sections 2a to each other arranged in a plurality of cells, and the second electrode 3 has second connection parts 3b for connecting the second electrode sections 3a to each other arranged in a plurality of cells. A plane shape of each connection part is a band-like shape in the simplest case and a width thereof may be approximately 0.2 to 2 mm, but the shape and the like thereof are not limited in particular. However, if the first electrode 2 and the second electrode 3 are formed on the same surface, the first connection parts 2b and the second connection parts 3b are arranged so as not to cross each other.

Figure 3:
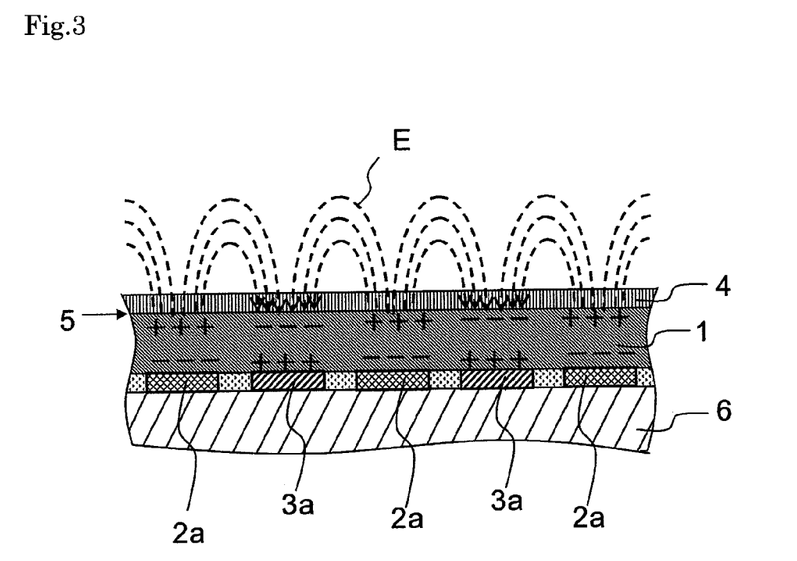
FIG. 3 is a cross-sectional schematic diagram of a bipolar electrostatic chuck of the present invention viewed from the II-II direction (II'-II' direction) of FIG. 1.

The electrode layer obtained by the above-mentioned electrode shape condition has, as understood from the cross-sectional schematic diagram illustrated in FIG. 3, the first electrode and the second electrode for generating a potential difference when a voltage is applied, which are arranged so as to be adjacent to each other both in the x direction and in the y direction (both the II-II cross section and the II'-II' cross section of FIG. 1 become as illustrated in FIG. 3). Therefore, after the voltage application is stopped, the charges formed on the substrate attracting surface of the upper insulating layer and its vicinity can be effectively disappeared by being canceled with neighboring charges having the opposite polarity. As a result, formation of residual charges can be prevented as much as possible. In addition, according to the electrostatic chuck having such electrode layer, as illustrated in FIG. 3, most of the electric flux lines E are generated to be tight on the substrate attracting surface and its vicinity. This means that, for example, compared with a conventional electrostatic chuck as illustrated in FIG. 6(b), the electric flux lines E are formed within a range of a short distance. As a result, this fact reduces probability of attracting floating charged particles and other foreign substances to the electrostatic chuck.

In addition, the first electrode and/or the second electrode may have an electrodeless portion where the electrode section does not exist in the virtual cell, so as to have an insulating layer top where the upper insulating layer protrudes to the substrate side at the position corresponding to the electrodeless portion as described later. In other words, the electrodeless portion where the electrode section does not exist is formed in at least one of the virtual cells on the surface of the electrode layer, and the upper insulating layer has the insulating layer top at the position corresponding to the electrodeless portion, with a result that only this insulating layer top contacts with the substrate so as to form the substrate attracting surface. This electrodeless portion means that some of electrode sections, which exist originally, are missing according to the electrode shape condition of the present invention. For instance, in the example illustrated in FIG. 4, places of cells $(x_1, y_1)$, $(x_4, y_1)$, $(x_1, y_4)$, and $(x_4, y_4)$ are electrodeless portions 2c and 3c, which are places where the first electrode section 2a, the second electrode section 3a, the second electrode section 3a, and the first electrode section 2a are disposed in this order according to the electrode shape condition described above. The amount and numbers of such electrodeless portions are formed may be set appropriately in accordance with a type and a size of the substrate to be attracted. In order that uniform attraction force is formed on the substrate attracting surface, the number of the electrodeless portions 2c of the first electrode may be the same as the number of the electrodeless portions 3c of the second electrode, and the weight of the substrate may be applied uniformly to the insulating layer tops disposed to correspond to the electrodeless portions.

Figure 4:
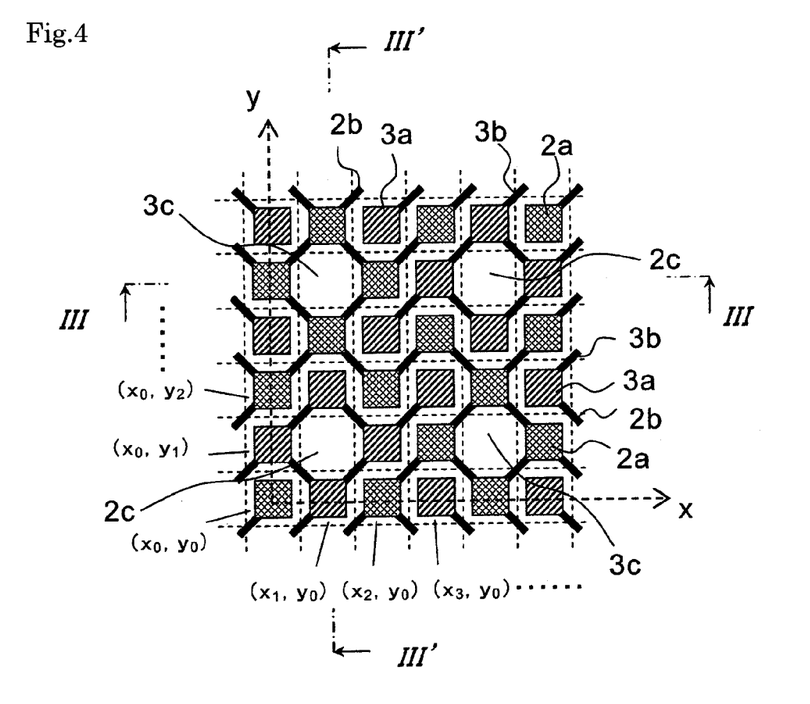
FIG. 4 is a plan explanatory diagram of the case where the first electrode and the second electrode forming the electrode layer of the present invention have an electrodeless portion.
Figure 5:
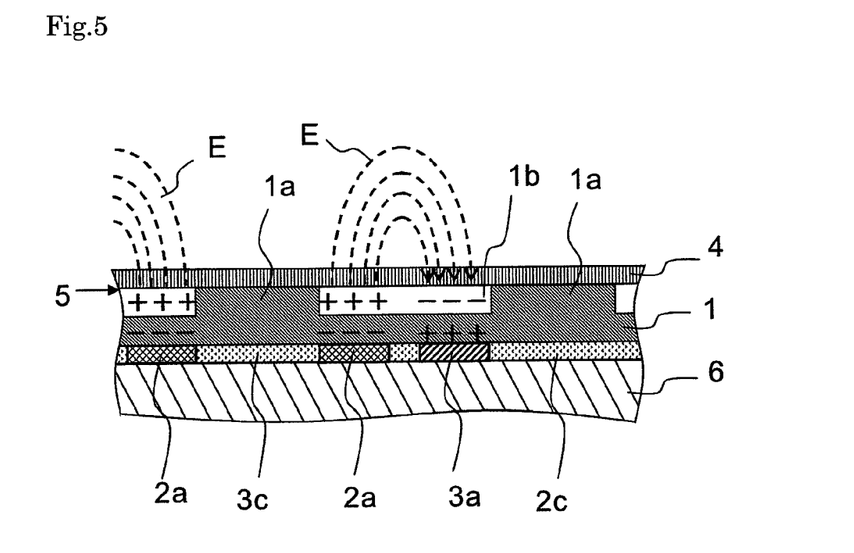
FIG. 5 is a cross-sectional schematic diagram of the bipolar electrostatic chuck of the present invention viewed from the III-III direction (III'-III' direction) of FIG. 4.

According to the electrostatic chuck in which the electrode forming the electrode layer has the electrodeless portion and the upper insulating layer has the insulating layer top at the position corresponding to the electrodeless portion, the electric flux lines E do not pass through an insulating layer top 1a contacting with the substrate as illustrated in FIG. 5 (both the III-III cross section and the III'-III' cross section illustrated in FIG. 4 become as illustrated in FIG. 5). For this reason, the charges generated by the voltage application and the number of charged particles such as ions and electrons that are induced are decreased at least in the part of the upper insulating layer where the substrate contact with (insulating layer top). Thus, residual attraction force when the voltage application is stopped can be further reduced.

The electrode layer of the electrostatic chuck according to the present invention may have the first electrode and the second electrode as described above, and the first electrode and the second electrode may be formed on the same surface in the electrode layer, or the first electrode and the second electrode may be formed on the upper side and the lower side of an inter-electrode insulating layer made of an insulating film or insulating adhesive. However, it is preferred to form the first electrode and the second electrode on the same surface because it becomes difficult for the residual charges to be formed. In addition, a gap between the electrodes maybe filled with insulating adhesive such as epoxy resin or silicone resin, or a part of thermoplastic polyimide adhesive sheet in any one of the case where the first electrode and the second electrode are formed on the same surface and the case where the first electrode and the second electrode are formed via the inter-electrode insulating layer.

The method of forming of the first electrode and the second electrode is not limited in particular. For instance, thermal-spray or vapor deposition of metal such as copper, aluminum, nickel, or tungsten may be performed with a mask so as to form a predetermined electrode shape, or a metal layer may be formed by using metal foil, plating, or ion plating and then a predetermined electrode shape may be obtained by etching. A thickness of the electrodes depends on the method of forming the electrodes, but it may be in the range that is usually adopted. For instance, in the case where the electrodes are formed of metal foil, it is mainly in the range of 5 to 30 μm. In the case where the electrodes are formed by ion plating method, it is mainly in the range of 0.1 to 2 μm. In the case where the electrodes are formed by thermal-spray of metal, it is mainly in the range of 30 to 50 μm.

In addition, the upper insulating layer in the present invention may have the substrate attracting surface for attracting a substrate, but its material and the like are not limited in particular. It maybe formed of an insulating film such as a polyimide film, a silicone film, and a polyamide film, or formed of a ceramic material such as alumina or aluminum nitride. A thickness of the upper insulating layer depends on a material of the insulating layer, but it may be in the range that is usually adopted. For instance, in the case where the insulating layer is made of a polyimide film or the like, the thickness of the upper insulating layer is mainly in the range of 25 to 200 μm. If the insulating layer is formed by thermal-spray of a ceramic material, the thickness of the upper insulating layer is mainly in the range of 100 to 500 μm.

If at least one of the electrodes forming the electrode layer has the electrodeless portion, the upper insulating layer is provided with the insulating layer top 1a protruding to the substrate side at the position corresponding to the electrodeless portion, with a result that the insulating layer top 1a contacts with the substrate for forming the substrate attracting surface 5. Thus, the number of charges accumulated in the part contacting with the substrate can be reduced as much as possible. It is preferred that the insulating layer top 1a have a plane shape contained in the range of the virtual cell corresponding to the electrodeless portion, considering substrate attraction maintenance performance or reducing performance of the accumulated charges, but it is possible that the insulating layer top 1a is formed to exceed the cell size and overlap part of neighboring cells. In addition, a height of the insulating layer top 1a (i.e., depth of insulating layer recess 1b) may be in the range of 5 to 20 μm, from a viewpoint of maintenance of the substrate attraction force, suppression of an unevenness or a swell of the substrate back surface when the substrate is attracted, or processability. As the method of forming the insulating layer top 1a on the upper insulating layer, for example, thermal-spray of a ceramic material using a predetermined mask may be adopted, or it is possible to form the upper insulating layer with a polyimide film or the like and then to form the insulating layer recess 1b by an etching process.

In addition, the bipolar electrostatic chuck according to the present invention may have the electrode layer and the upper insulating layer laminated with adhesive or an adhesive film between the electrode layer and the upper insulating layer, or the upper insulating layer may be formed directly on the surface of the electrode layer. Further, a lower insulating layer made of an insulating film or a ceramic material similarly to the upper insulating layer may be disposed on the underside of the electrode layer (opposite side to the substrate attracting surface) so as to be adhered to a metal substrate made of aluminum or the like the with adhesive or the like, for obtaining the electrostatic chuck. In other words, it is possible to adopt a technology such as a structure and a manufacturing method that are adopted for a usual electrostatic chuck can be adopted unless the technology does not affect the effect of the present invention.

Advantageous Effects of Invention

According to the present invention, charges generated on the substrate attracting surface when a voltage is applied to the electrodes can be canceled efficiently with charges of the opposite polarity existing in the periphery. Therefore, residual charges can be canceled promptly when the voltage application is stopped. In addition, according to the electrode shape of the present invention, electric flux lines generated by the voltage application can stay in the vicinity of the substrate attracting surface. Therefore, an amount of attracted charged particles such as ions and electrons can be suppressed, with a result that the number of charges remaining on the substrate attracting surface can be minimized. For this reason, the bipolar electrostatic chuck of the present invention can reduce the residual charges promptly after the voltage application is stopped. In addition, the bipolar electrostatic chuck is also excellent in the substrate attracting/holding performance when a voltage is applied. In addition, it is possible to control the formation of the electric flux lines to be at the vicinity of the substrate attracting surface, with a result that amount of attracted charged particles floating around the electrostatic chuck can be reduced.

BRIEF DESCRIPTION OF DRAWINGS

FIG. 6 are explanatory diagrams illustrating a conventional example of the bipolar electrostatic chuck, in which FIG. 6(a) illustrates a plan schematic diagram while FIG. 6(b) illustrates a I-I cross-sectional schematic diagram.

DESCRIPTION OF EMBODIMENTS

Hereinafter, the present invention is described in more detail with reference to examples.

Example 1

A polyimide sheet (Kapton-H manufactured by DuPont-Toray Co., Ltd. having a thickness of 125 μm) having a diameter of 298 mm was prepared as a lower insulating layer 6, and a chrome layer having a thickness of 0.1 μm was formed on the surface thereof to make a smooth surface by processing the surface in advance by the ion plating method. Next, an electrode layer made of copper having a diameter of 296 mm and a thickness of 0.5 μm was formed on the chrome layer of the polyimide sheet by the ion plating method, and a first electrode 2 and a second electrode 3 as illustrated in FIGS. 1 and 2 were obtained by etching using nitrate etchant. Here, a virtual cell width L was set to 5 mm, and first electrode sections 2a and second electrode sections 3a each have dimensions of 4.5 mm×4.5 mm. The first electrode sections 2a and the second electrode sections 3a were arranged in cells alternately in a x direction and in a y direction, and a space d between neighboring electrode sections was set to 1 mm both in the x direction and in the y direction (59 electrode sections were arranged at most in the diameter direction). In addition, the first electrode section 2 and the second electrode section 3 arranged in the virtual cells were connected to each other to be the same potential, respectively, with a first connection part 2b and a second connection part 3b each of which has a band-like shape with a width of 0.5 mm.

Next, a polyimide sheet (Kapton-H manufactured by DuPont-Toray Co., Ltd. having a thickness of 75 μm) having a diameter of 296 mm was glued via thermoplastic polyimide adhesive sheet having a thickness of 30 μm to the surface of the electrode layer on which the first electrode 2 and the second electrode 3 were formed as described above, so as to make an upper insulating layer 1. Next, a cushion member was overlaid on each surface of the upper insulating layer 1 and the lower insulating layer 6, and they were set together in a hot press machine so as to perform a hot press process under the condition of pressure of 2 MPa in the thickness direction, heating temperature of 150° C., and holding time of 5 minutes. Thus, an electrode sheet constituted of the upper insulating layer 1, the electrode layer (the first electrode 2 and the second electrode 3), and the lower insulating layer 6 was obtained. Then, the obtained electrode sheet was fixed to a metal base made of aluminum with a stage surface having a diameter of 298 mm via a thermoplastic polyimide adhesive sheet having a thickness of 30 μm, with a result that a bipolar electrostatic chuck according to example 1 was completed.

Using the bipolar electrostatic chuck obtained as described above, a silicon wafer having a diameter of 300 mm was placed on the surface of the upper insulating layer 1 as the substrate attracting surface, and the first electrode 2 was connected to a positive electrode side of a DC power supply while the second electrode 3 was connected to a negative electrode side of the DC power supply so that a voltage of ±750 V was applied for attracting and holding the silicon wafer for one minute. After that, the power supply was turned off so that the voltage application was stopped. Then, one second later, the silicon wafer was separated from the substrate attracting surface by using a lifting pin, and the silicon wafer was able to be separated without particular force.

Example 2

As to the first electrode 2 and the second electrode 3 forming the electrode layer, as illustrated in FIG. 4, electrode sections of apex portions of 4×4 virtual cells were eliminated, with a result that the number of electrodeless portions 2c in which the first electrode section 2a was missing was the same as the number of electrodeless portions 3c in which the second electrode section 3a was missing on the surface of the electrode layer. Other structure was the same as in example 1 for obtaining the electrode sheet. Next, the surface of the upper insulating layer 1 was covered with a mask, and etching was performed by using alkali etchant only for polyimide (product name: polyimide etchant manufactured by Mitsubishi Paper Mills Ltd.), so as to eliminate the polyimide sheet except for places corresponding to the virtual cells of the electrodeless portions 2c and 3c by a depth of 10 μm (corresponding to insulating layer recess 1c). Thus, insulating layer tops 1a having a size of 5 mm×5 mm and a height of 10 μm were formed. Next, the electrode sheet with the formed insulating layer tops 1a was fixed to the metal base made of aluminum similarly to example 1, with a result that a bipolar electrostatic chuck according to example 2 was completed.

As to the bipolar electrostatic chuck obtained as described above, similarly to example 1, a silicon wafer was attracted and held by the substrate attracting surface constituted of the insulating layer top 1a, and then the power supply was turned off so that the voltage application was stopped. Then, one second later, the silicon wafer was separated from the substrate attracting surface by using the lifting pin. The silicon wafer was able to be separated without particular force.

Industrial Applicability

The bipolar electrostatic chuck according to the present invention is suitable for attracting and holding a semiconductor wafer of silicon, gallium arsenide, silicon carbide (SiC), or the like, a glass substrate, or an insulating substrate such as a resin sheet that is used for an organic EL or the like. In particular, the bipolar electrostatic chuck is suitable for use in successive steps of a semiconductor manufacturing process or the like, because the bipolar electrostatic chuck is a bipolar electrostatic chuck that has excellent substrate attracting/holding performance when a voltage is applied, and excellent residual charges reducing performance when the voltage application is stopped. As a matter of course, the electrostatic chuck of the present invention can be applied to various applications for attracting an object.

REFERENCE SIGNS LIST

1: upper insulating layer
2: first electrode
2a: first electrode section
2b: first connection part 2c: electrodeless portion
3: second electrode
3a: second electrode section
3b: second connection part
3c: electrodeless portion
4: substrate
5: substrate attracting surface
6: lower insulating layer
7: metal base
8, 9: electrode

The invention claimed is:

1. A bipolar electrostatic chuck, at least comprising:

an electrode layer including a first electrode and a second electrode; and an upper insulating layer which forms a substrate attracting surface for attracting a substrate, wherein in a case where a surface of the electrode layer is regarded to be divided into a plurality of virtual cells having a predetermined width (L) arranged in an x direction and a y direction, first electrode sections forming the first electrode and second electrode sections forming the second electrode are alternately arranged in the plurality of virtual cells in the x direction, and are alternately arranged in the plurality of virtual cells in the y direction, with a space (d) between the first electrode section and the second electrode section which are adjacent to each other, wherein the first electrode sections and the second electrode sections are disposed, so that a plurality of electrodeless portions having no electrode section are formed in the virtual cells, wherein, the substrate attracting surface of the upper insulating layer has protrusions protruding to the substrate side at a position corresponding to the electrodeless portion, so that top surfaces of the protrusions contact with the substrate to form the substrate attracting surface, and wherein the upper insulating layer comprises a film selected from the group consisting of a polyimide film, a silicone film, and a polyamide film.

2. A bipolar electrostatic chuck according to claim 1, wherein the first electrode includes first connection parts for connecting the first electrode sections to each other arranged in the plurality of virtual cells and the second electrode includes second connection parts for connecting the second electrode sections to each other arranged in the plurality of virtual cells.

3. A bipolar electrostatic chuck according to claim 1 or 2, wherein the first electrode and the second electrode are formed on the same surface of the electrode layer.

4. A bipolar electrostatic chuck according to claim 1, wherein the cell width (L) has a value within a range of 1 to 20 mm in a case where the substrate is a silicon wafer having a diameter of 300 mm.

5. A bipolar electrostatic chuck according to claim 4, wherein the space (d) between the first electrode section and the second electrode section of neighboring cells in the x direction or in the y direction has a value within a range of 0.5 to 2 mm.

* * * * *